United States Patent [19]

Grundy

[11] 4,069,494
[45] Jan. 17, 1978

[54] INVERTER CIRCUIT ARRANGEMENTS

[75] Inventor: David Latham Grundy, Saddleworth, England

[73] Assignee: Ferranti Limited, Hollinwood, Lancashire, England

[21] Appl. No.: 658,403

[22] Filed: Feb. 17, 1976

Related U.S. Application Data

[62] Division of Ser. No. 442,823, Feb. 15, 1974, abandoned.

[30] Foreign Application Priority Data

Feb. 17, 1973 United Kingdom ............... 07910/73

[51] Int. Cl.² .................. H01L 27/04; H01L 27/02
[52] U.S. Cl. ........................ 357/41; 357/43; 357/48; 357/51; 307/213; 307/214; 307/215; 307/304
[58] Field of Search ............ 357/43, 48, 51, 41, 357/40; 307/214, 213, 215, 303, 304

[56] References Cited

U.S. PATENT DOCUMENTS

| | | | |
|---|---|---|---|
| 3,590,343 | 6/1971 | Nathanson | 357/43 |
| 3,595,715 | 7/1971 | Thire et al. | 357/43 |
| 3,609,479 | 9/1971 | Lin | 357/43 |
| 3,703,650 | 11/1972 | Kendall | 357/43 |
| 3,827,034 | 7/1974 | Colaco | 357/43 |
| 3,838,440 | 9/1974 | McCaffrey et al. | 357/43 |

*Primary Examiner*—Andrew J. James
*Attorney, Agent, or Firm*—Cameron, Kerkam, Sutton, Stowell & Stowell

[57] ABSTRACT

An inverter has a bipolar transistor and a field-effect transistor. The base gate electrodes are connected to the inverter input, and the collector and source electrodes are connected to the inverter output. The transistors are in series between supply rails. The lower of two possible input voltage levels causes the bipolar transistor to be switched OFF and the field-effect transistor to be switched ON, and the higher possible input voltage level causes the bipolar transistor to be switched ON and the field-effect transistor to be switched OFF. Base current level control is provided for discharging parasitic capacitance across the bipolar transistor when the latter is switched ON.

12 Claims, 5 Drawing Figures

INVERTER CIRCUIT ARRANGEMENTS

This is a division of application Ser. No. 442,823, filed Feb. 15, 1974, now abandoned.

This invention relates to inverter circuit arrangements suitable for monolithic construction within a semiconductor body.

According to the present invention an inverter circuit arrangement has a bipolar transistor and a field-effect transistor, both the base of the bipolar transistor and the gate of the field-effect transistor are connected to the input of the inverter, and both the collector of the bipolar transistor and the source of the field-effect transistor are connected to the output of the inverter.

Where an N-P-N bipolar transistor is used it is connected to a P-channel field-effect transistor.

When the potential level of the input of the inverter is sufficiently low to switch OFF the bipolar transistor of the field-effect transistor is switched ON, and when the potential level of the input is sufficiently high to switch ON the bipolar transistor the field-effect transistor is switched OFF. Thus, when the potential level of the input is at the higher of two possible levels the potential level of the output is at the lower of two possible levels, and vice versa.

Inevitably, there is parasitic capacitance associated with the bipolar transistor, this parasitic capacitance being charged when the bipolar transistor is switched OFF, and being discharged when the bipolar transistor is switched ON. For the satisfactory operation of the inverter, it is necessary, when the parasitic capacitance is charged and the bipolar transistor is then caused to be switched ON, for the parasitic capacitance to be discharged as quickly as possible. The rate of discharge of the parasitic capacitance depends on the base current level of the bipolar transistor. Hence, it is desirable to provide means within the inverter circuit arrangement to ensure that the base current level of the bipolar transistor is larger than the minimum value for the bipolar transistor to conduct.

The means to cause the base current level of the bipolar transistor to be larger than the minimum value for the bipolar transistor to conduct may comprise a parallel combination of a resistor and a capacitor. Alternatively, the means may comprise a junction diode arranged to operate at a lower bias potential level than is conventionally required for the diode, to cause the diode to have asymmetrical conduction properties, and so to be equivalent to a parallel combination of a resistor and a capacitor, the junction depletion capacitance of the diode providing the required capacitance.

Inverter circuit arrangements embodying the present invention dissipate direct-current electrical energy substantially only when charging the parasitic capacitance, and in consequence the direct-current energy dissipation rate of the inverter is small.

The field-effect transistor may comprise either a P-N junction field-effect transistor or an insulated gate field-effect transistor.

The inverter circuit arrangement referred to above may be included in a more complex logical circuit arrangement, possibly a plurality of such inverters being included in a complex logic circuit arrangement.

Inverter circuit arrangements embodying the present invention are particularly suitable for construction in a monolithic semiconductor body. Such a semiconductor body may comprise an epitaxial layer of one conductivity type on a substrate of the same conductivity type, the collector of the opposite conductivity type of the bipolar transistor comprising both a heavily doped isolation barrier for the bipolar transistor and a heavily doped buried layer at the interface between the epitaxial layer and the substrate, the isolation barrier extending through the epitaxial layer into contact with the buried layer. There the field-effect transistor comprises a P-N junction field-effect transistor, the channel of the field-effect transistor may comprise a region of the epitaxial layer surrounded within the semiconductor body by a part of the semiconductor body comprising a combination of an isolation barrier for the field-effect transistor and a heavily doped buried layer at the interface between the epitaxial layer and the substrate, the isolation barrier extending through the epitaxial layer into contact with its associated buried layer.

Preferably, then, the bipolar transistor comprises a so-called collector-diffusion-isolation transistor, and the P-N junction field-effect transistor has substantially the same construction. Such a bipolar transistor, and a P-N junction field-effect transistor, have low leakage currents in operation. A low voltage is required for the gate of the field-effect transistor, whether it is a P-N junction field-effect transistor or an insulated gate field-effect transistor, to cause the field-effect transistor to switch OFF, and this is provided conveniently from a low supply voltage for driving the inverter.

Embodiments of the present invention will now be specifically described, by way of example, with reference to the accompanying drawings, in which.

Figure 1:
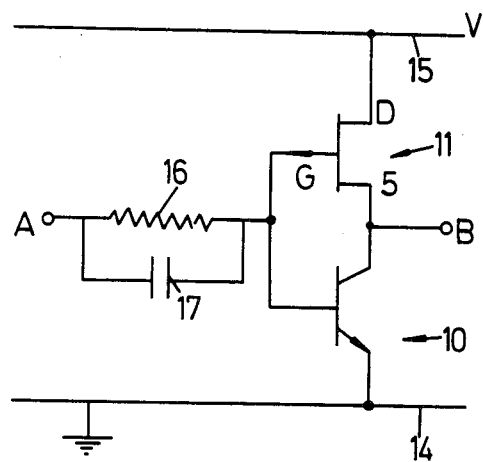
FIG. 1 is a circuit diagram of an inverter circuit arrangement embodying the present invention.

The inverter circuit arrangement shown in FIG. 1 comprises an N-P-N bipolar transistor 10 and a P-channel P-N junction field-effect transistor 11. The base of the bipolar transistor 10 and the gate of field-effect transistor 11 are connected to the input 'A' of the inverter. The output 'B' of the inverter is connected to a point between the collector of the bipolar transistor 10 and the source of the field-effect transistor 11. The bipolar transistor and the field-effect transistor are thus in series, and are between the rails 14 and 15 for an electrical supply to drive the inverter; the emitter of the bipolar transistor being connected to the rail 14 maintained at zero potential, and the drain of the field-effect transistor being connected to the rail 15 maintained at a finite positive potential level 'V'.

The arrangement is such that when the potential level of the input 'A' of the inverter is sufficiently low to switch OFF the bipolar transistor the field-effect transistor is switched ON, and when the potential level of the input 'A' is sufficiently high to switch ON the bipolar transistor the field-effect transistor is switched OFF. Hence, when the potential level of the input 'A' is at the higher of two possible levels the potential of the output 'B' is at the lower of two possible levels, and vice versa. Although there may be a small direct current flow through both the bipolar transistor and the field-effect transistor, it is insignificant compared with the capacitance discharge current.

Inevitably, there is a parasitic capacitance across the bipolar transistor 10. This parasitic capacitance (not shown) is charged when the bipolar transistor is switched OFF, and is discharged when the bipolar transistor is switched ON. When the parasitic capacitance is charged, and the bipolar transistor is then caused to be switched ON, it is desirable to discharge the parasitic capacitance as quickly as possible. The rate of discharge of the parasitic depends on the base current level of the bipolar transistor. Hence, in the illustrated inverter circuit arrangement it is ensured that the base current level of the bipolar transistor is larger than the minimum value for the bipolar transistor to conduct by providing means between the input 'A' and the base of the bipolar transistor. This means comprises a parallel combination of a resistor 16 and a capacitor 17, both these circuit elements having high values.

The inverter circuit arrangement according to the present invention may be included in a more complex logical circuit.

Figure 2:
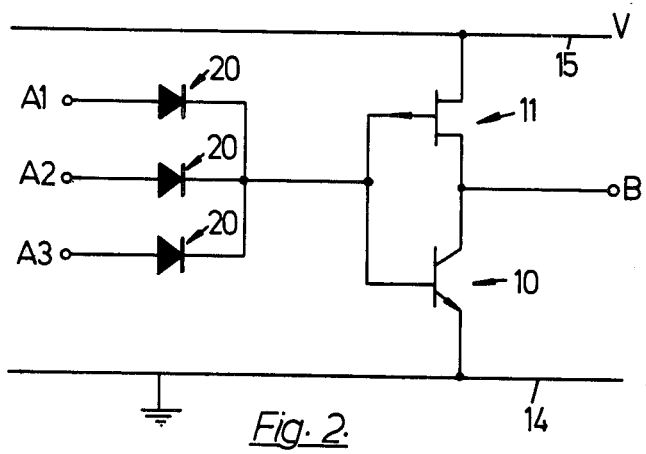
FIG. 2 is a circuit diagram of a three-input NOR gate in positive logic and including an inverter embodying the present invention.

FIG. 2 is a circuit diagram of a three-input NOR gate in positive logic and including an inverter of which parts identical to those of FIG. 1 are given the same reference numerals. The inputs 'A1', 'A2' and 'A3' to the gate are each via a respective one of junction diodes 20, each diode being connected to both the gate of the field-effect transistor and the base of the bipolar transistor of the inverter circuit arrangement. The means to case the base current level of the bipolar transistor 10 of the inverter circuit arrangement to be larger than the minimum value for the bipolar transistor to conduct comprises the junction diode 20 between each input 'A1', 'A2' and 'A3' of the device and the base of the bipolar transistor. Each junction diode is arranged to operate at a lower bias potential level than is conventionally required for the diode, to cause the diode to have asymmetrical conduction properties, and so to be equivalent to the parallel combination of the resistor 16 and capacitor 17 of FIG. 1. The junction depletion capacitance of each diode 20 is equivalent to the capacitor 17.

A plurality of inverters according to the present invention may be provided in a more complex logical circuit arrangement.

Figure 3:
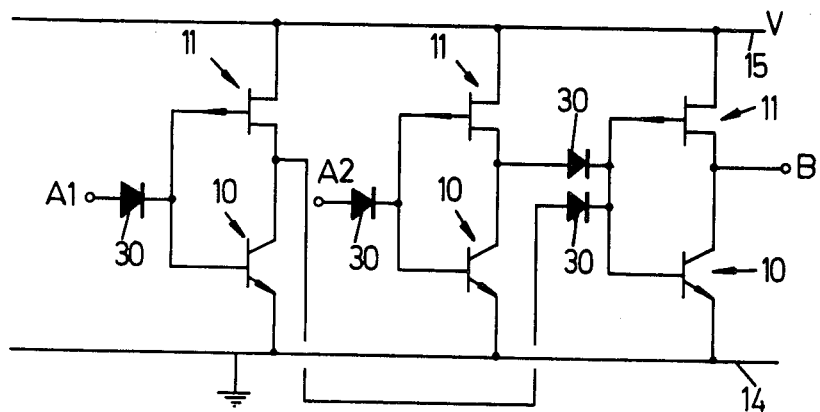
FIG. 3 is a circuit diagram of a two-input CR gate in negative logic and including inverters embodying the invention.

The circuit diagram of a two input OR gate in negative logic, and including three inverters connected in parallel with each other across the supply, is shown in FIG. 3, parts identical to the parts of FIG. 1 being given the same reference numerals in FIG. 3. The means to cause the base current level of the bipolar transistor of each inverter to be larger than the minimum value for the bipolar transistor to conduct is provided between the input of the associated inverter and the base of the bipolar transistor. Each such means comprises a junction diode 30 arranged to operate at a lower bias potential level than is conventional, as for the diodes 20 of FIG. 2. The two inputs 'A1'and 'A2' of the OR gate comprise the inputs to two of the inverters. The third inverter has two inputs comprising the outputs of the other two inverters, a diode 30 being provided also in each input circuit of this third inverter. The output 'B' of the third inverter is also the output of the OR gate.

A device with one of the circuit arrangements of FIGS. 1 to 3 dissipates direct-current electrical energy substantially only when charging the parasitic output capacitance associated with the bipolar transistor 10 of each inverter, and in consequence the direct-current energy dissipation rate of each device is small.

Each device described above is readily fabricated in a monolithic semiconductor body.

Figure 4:
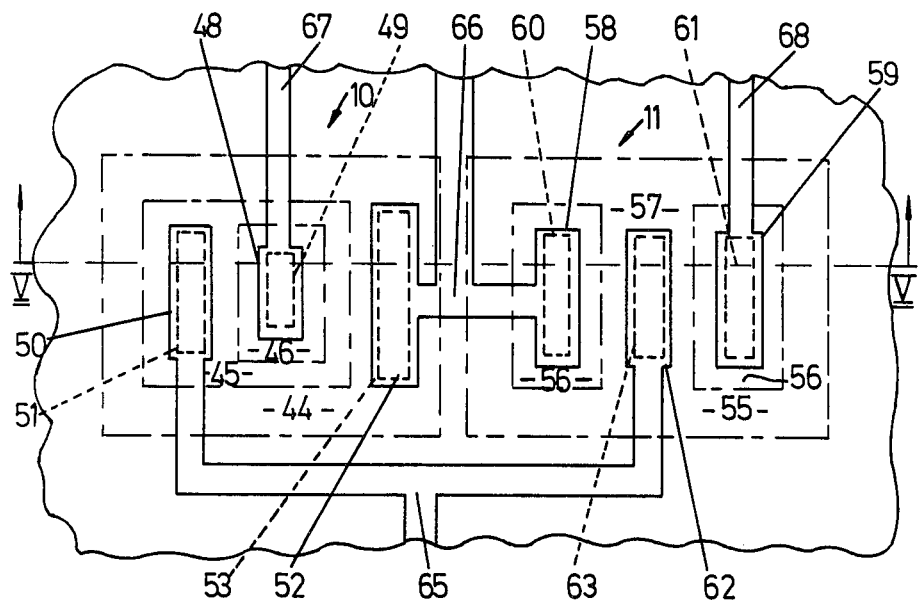
FIG. 4 is a diagrammatic plan view of part of the inverter of FIG. 1 when made in a semiconductor body.
Figure 5:
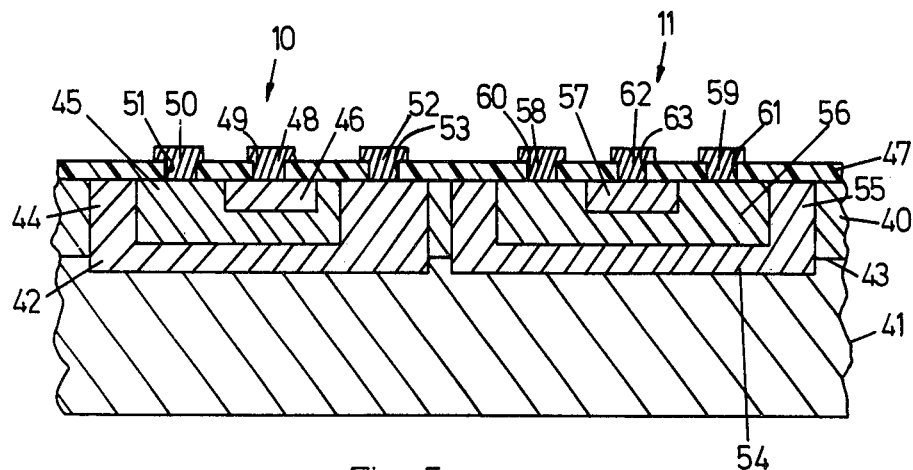
FIG. 5 is a section on the line V — V of FIG. 4.

A plan view of the construction of a part of a monolithic inverter is shown in FIG. 4, and a section on the line V — V of FIG. 4 is shown in FIG. 5. The means to cause the bipolar transistor of the inverter to have a base current level greater than the minimum value to cause the bipolar transistor to conduct is omitted from FIGS. 4 and 5.

As shown in FIG. 5, the N-P-N bipolar transistor 10 of the inverter has the so-called collector-diffusion-isolation construction and is formed in a silicon semiconductor body comprising a shallow P-type epitaxial layer 40 on a P-type substrate 41. The surface portion of the epitaxial layer remote from the substrate is of P+ type, being formed by a non-selective diffusion step. For convenience, the P+ type surface portion is not shown. The collector of the transistor comprises both a buried N+ type layer 42 at the interface 43 between the epitaxial layer 40 and the substrate 41, and an N+ type isolation barrier 44 for the transistor, the isolation barrier 44 extending through the epitaxial layer 40 into contact with the buried layer 42. The collector 42, 44 defines a P-type base 45 within the epitaxial layer 40, and an emitter 46 is formed by the selective diffusion of a suitable impurity into part of the base 45. Contacts are provided on the surface of the epitaxial layer remote from the substrate, the contacts extending through apertures in a layer of passivating material 47. The contacts comprise an emitter contact 48 extending through an aperture 49, a base contact 50 extending through an aperture 51, and a collector contact 52 extending through an aperture 53. In FIG. 4, in which the passivating layer is not shown, the surface portions of the P-N junctions are indicated by chain-dotted lines, and the contacts which are indicated by continuous lines, extend through apertures in the passivating layer indicated by broken lines. The buried layer 42 is also not indicated in FIG. 4.

The passivating layer 47 is of silicon oxide, and is deposited on the surface of the epitaxial layer 40 from a suitable reaction atmosphere. The silicon oxide is employed as a diffusion-resistant material during the diffusion steps employed in forming the inverter, and is then retained on the surface for passivation purposes, covering at least otherwise exposed surface portions of the P-N junctions.

Also included in the inverter is the P-N junction field-effect transistor 11, provided within the semiconductor body simultaneously with the provision of the collector-diffusion-isolation bipolar transistor 10, and having a construction closely resembling that of the bipolar transistor. As shown in FIG. 5, another combination of a buried layer 54 and an isolation barrier 55 defines another P-type region 56 within the epitaxial layer 40, the region 56 comprising the channel of the field-effect transistor. The N+ type gate 57 of the field-effect transistor is formed simultaneously with the emitter 46 of the bipolar transistor 10, and extends at its ends into the N+ type isolation barrier 55. Contacts 58 and 59, which extend, respectively, through apertures 60 and 61 in the passivating layer 47, are provided for the source and drain of the field-effect transistor, one such contact 58 and 59 being formed on the channel 56 on either side of the gate 57. A contact 62, which extends through an aperture 63 in the passivating layer 47, is provided for the gate 57.

The contacts of the inverter are provided by etching in an appropriate manner an initially-continuous layer of aluminium provided on the silicon oxide passivating layer and within the apertures formed in the passivating layer. The electrical interconnections between the bipolar transistor and the field-effect transistor of the invert, between these circuit elements and the means to raise the base current level of the bipolar transistor, and between the inverter and other components formed in the semiconductor body, and required to be metal conductors, are formed from the metal layer simultaneously with the contacts, and are illustrated by continuous lines in FIG. 4. The conductors include one 65 between the base of the bipolar transistor and the gate of the field-effect transistor and to input 'A', one 66 between the collector and the source and to the output'B', one 67 between the rail at zero potential (not shown) and the emitter, and one 68 between the drain and the rail maintained at potential 'V'.

The provision of the non-selective P+ type portion (not shown) of the epitaxial layer may be omitted, but this portion helps to stabilise any resistor of the inverter, helps to prevent surface inversion and causes the gain bandwidth produce of the bipolar transistor to be increased.

The fabrication of the inverter in the semiconductor body is facilitated by the collector-diffusion-isolation bipolar transistor and the P-N junction field-effect transistor having substantially the same construction as each other. Other types of circuit element to be included in the semiconductor body also may have a similar construction. Howver, each circuit element to be included in the semiconductor body, conveniently, may have any suitable construction.

The provision of the inverter is facilitated by employing a bipolar transistor of the collector-diffusion-isolation construction, because such a transistor may occupy a smaller part of the contact-bearing surface of the semiconductor body in which the inverter is formed, and requires fewer processing steps in its fabrication than most other known forms of bipolar transistor. A collector-diffusion-isolation bipolar transistor and a field-effect transistor having a similar construction, in operation have low leakage current therefrom.

The positive potential level 'V' of the electrical supply to drive the inverter may be about 1 volt. The low potential level of the electrical supply to drive the inverter is compatible with the small positive potential level of the gate of the field-effect transistor, being required to cause the field-effect transistor to switch OFF, for example, being 0.5 volt.

The P-N junction field-effect transistor of the inverter may be replaced by an insulated-gate field-effect transistor.

I claim:

1. An inverter circuit arrangement within a monolithic semiconductor body comprising a shallow epitaxial layer of one conductivity type on a substrate of the same conductivity type, the arrangement including at least a pair of circuit elements spaced from each other within the semiconductor body, each circuit element including a defined region of the epitaxial layer, a buried layer of opposite conductivity type at the interface between the defined region of the epitaxial layer and the substrate, a heavily doped isolation barrier of opposite conductivity type, said isolation barrier extending through the epitaxial layer into contact with the buried layer, and the defined region including a surface portion remote from the substrate, said surface portion having a part which is of said opposite conductivity type, one of said pair of circuit elements comprising a bipolar transistor with a collector comprising the combination of the buried layer and the isolation barrier, a base including an unmodified part of the defined region of the epitaxial layer, an emitter comprising the part of said opposite conductivity type of the surface portion of the defined region, the emitter being surrounded by material of said one conductivity type within the semiconductor body, and the bipolar transistor having electrode connections to the collector, the base and the emitter, the other circuit element comprising a field-effect transistor with a channel region including an unmodified part of the defined region of the epitaxial layer, the part of said opposite conductivity type of the surface portion of the defined region is contiguous with the isolation barrier, and bisects the remaining part of said one conductivity type of the surface portion into two regions, the part of said opposite conductivity type comprising the gate of the field-effect transistor, the remaining two regions of the surface portion comprising the source and the drain, and the field-effect transistor having electrode connections to the gate, the source and the drain, there also being provided within the circuit arrangement electrical connections such that the base of the bipolar transistor and the gate of the field-effect transistor are connected in common to receive input signals to the circuit arrangement, the collector of the bipolar transistor and the source of the field-effect transistor are connected in common to provide the output for the circuit arrangement, the drain of the field-effect transistor is connected to a point to be maintained at a first reference potential level, and the emitter of the bipolar transistor is connected to a point to be maintained at a second reference potential level, each input signal to the circuit arrangement to have two possible voltage levels, with one of the two possible input voltage levels causing the bipolar transistor to be switched ON and the field-effect transistor to be switched OFF, and the other of the two possible input voltage levels causing the bipolar transistor to be switched OFF and the field-effect transistor to be switched ON.

2. A circuit arrangement as set forth in claim 1 wherein said field-effect transistor is of the P-channel type and the bipolar transistor is of the NPN type, and said first reference potential level is more positive than the second reference potential level.

3. A circuit arrangement as set forth in claim 1 wherein means is connected in the input signal path for ensuring that the current level through the base region of the bipolar transistor becomes significantly larger than the minimum required for conduction of the bipolar transistor.

4. A circuit arrangement as set forth in claim 3 wherein the means connected in the input signal path comprises a parallel combination of a resistor and a capacitor.

5. A circuit arrangement as set forth in claim 3 wherein the means connected in the input signal path comprises a junction diode biased for asymmetric conduction.

6. A circuit arrangement as set forth in claim 3 wherein the means connected in the input signal path comprises a NOR gate including a plurality of junction diodes each connected to the inverter input and biased for asymmetric conduction.

7. An inverter circuit arrangement within a monolithic semiconductor body comprising a shallow epitaxial layer of one conductivity type on a substrate of the same conductivity type, the arrangement including a plurality of inverters with each inverter comprising a pair of circuit elements spaced from each other within the semiconductor body, each circuit element including a defined region of the epitaxial layer, a buried layer of opposite conductivity type at the interface between the defined region of the epitaxial layer and the substrate, a heavily doped isolation barrier of opposite conductivity type, said isolation barrier extending through the epitaxial layer into contact with the buried layer, and the defined region including a surface portion remote from the substrate, said surface portion having a part which is of said opposite conductivity type, one of said pair of circuit elements comprising a bipolar transistor with a collector comprising the combination of the buried layer and the isolation barrier, a base including an unmodified part of the defined region of the epitaxial layer, an emitter comprising the part of said opposite conductivity type of the surface portion of the defined region, the emitter being surrounded by material of said one conductivity type within the semiconductor body, and the bipolar transistor having electrode connections to the collector, the base and the emitter, the other circuit element comprising a field-effect transistor with a channel region including an unmodified part of the defined region of the epitaxial layer, the part of said opposite conductivity type of the surface portion of the defined region is contiguous with the isolation barrier, and bisects the remaining part of said one conductivity type of the surface portion into two regions, the part of said opposite conductivity type comprising the gate of the field-effect transistor, the remaining two regions of the surface portion comprising the source and the drain, and the field-effect transistor having electrode connections to the gate, the source and the drain, there also being provided within the circuit arrangement electrical connections such that the base of the bipolar transistor and the gate of the field-effect transistor are connected in common to receive input signals to the circuit arrangement, the collector of the bipolar transistor and the source of the field-effect transistor are connected in common to provide the output for the circuit arrangement, the drain of the field-effect transistor is connected to a point to be maintained at a first reference potential level, and the emitter of the bipolar transistor is connected to a point to be maintained at a second reference potential level, each input signal to the circuit arrangement to have two possible voltage levels, with one of the two possible input voltage levels causing the bipolar transistor to be switched ON and the field-effect transistor to be switched OFF, and the other of the two possible input voltage levels causing the bipolar transistor to be switched OFF and the field-effect transistor to be switched ON.

8. A circuit arrangement as set forth in claim 7 wherein each field-effect transistor is of the P-channel type and each bipolar transistor is of the NPN type, and for each inverter said first reference potential level is more positive than the second reference potential level.

9. A circuit arrangement as set forth in claim 7 wherein separate means is connected in the input signal path for each inverter, each said means ensuring that the current level through the base region of the associated bipolar transistor becomes significantly larger than the minimum required for conduction of the bipolar transistor.

10. A circuit arrangement as set forth in claim 7 wherein the output of at least one of the inverters is connected to the input of another of the inverters.

11. A circuit arrangement as set forth in claim 10 wherein the separate outputs of at least two inverters are connected to the input of a further inverter.

12. A circuit arrangement as set forth in claim 11 wherein means is connected to the input signal path of said further inverter for ensuring that the current level through the base region of the bipolar transistor of the further inverter becomes significantly larger than the minimum required for conduction of the bipolar transistor, said means comprising a NOR gate including at least two junction diodes, the junction diodes being connected individually to the separate outputs of said at least two inverters, and are biased for asymmetric conduction.

* * * * *